United States Patent
Bonner

(10) Patent No.: US 9,928,314 B2
(45) Date of Patent: *Mar. 27, 2018

(54) FITTING SAMPLE POINTS WITH AN ISOVALUE SURFACE

(71) Applicant: DASSAULT SYSTEMES, Velizy Villacoublay (FR)

(72) Inventor: David Leo Bonner, Sevres (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 345 days.

This patent is subject to a terminal disclaimer.

(21) Appl. No.: 14/684,147

(22) Filed: Apr. 10, 2015

(65) Prior Publication Data

US 2015/0294036 A1    Oct. 15, 2015

(30) Foreign Application Priority Data

Apr. 10, 2014   (EP) .................................... 14305529

(51) Int. Cl.
*G06F 17/50*    (2006.01)
*G06F 17/10*    (2006.01)
(Continued)

(52) U.S. Cl.
CPC .............. *G06F 17/50* (2013.01); *G06F 17/10* (2013.01); *G06F 17/175* (2013.01);
(Continued)

(58) Field of Classification Search
CPC .... G06F 17/50; G06F 17/175; G06F 17/5086; G06F 17/5018; G06F 17/10; G06T 15/08;
(Continued)

(56) References Cited

U.S. PATENT DOCUMENTS 5,341,461 A    8/1994   Kikuchi et al.
5,371,845 A    12/1994  Newell et al.
(Continued)

FOREIGN PATENT DOCUMENTS

CN    101110127 A    1/2008
EP    2 600 315 A1   6/2013

OTHER PUBLICATIONS

Adi, "Particle Swarm Optimization for NURBS Curve Fitting", 2009 Sixth International Conference on Computer Graphics, Imaging and Visualization, 2009 IEEE, p. 261.*

(Continued)

*Primary Examiner* — Maurice L McDowell, Jr.
(74) *Attorney, Agent, or Firm* — Oblon, McClelland, Maier & Neustadt, L.L.P.

(57) ABSTRACT

The invention notably relates to a computer-implemented method for designing a three-dimensional modeled object that represents a physical entity. The method comprises providing sample points; determining a volumetric function, within a predetermined class of volumetric functions, as the optimum of an optimization program that explores orientation vectors defined at the sample points, wherein the optimization program penalizes a distance from the explored orientation vectors; and fitting the sample points with an isovalue surface of the volumetric function, wherein the program further penalizes oscillations of the fitted isovalue surface.

13 Claims, 6 Drawing Sheets

(51) Int. Cl.
  *G06T 17/00* (2006.01)
  *G06T 15/08* (2011.01)
  *G06F 17/17* (2006.01)

(52) U.S. Cl.
  CPC ...... *G06F 17/5018* (2013.01); *G06F 17/5086* (2013.01); *G06T 15/08* (2013.01); *G06T 17/00* (2013.01); *G06T 2210/56* (2013.01); *G06T 2215/06* (2013.01); *G06T 2215/16* (2013.01)

(58) Field of Classification Search
  CPC . G06T 17/00; G06T 2215/16; G06T 2215/06; G06T 2210/56
  See application file for complete search history.

(56) References Cited

U.S. PATENT DOCUMENTS

| | | | |
|---|---|---|---|
| 6,639,592 | B1 | 10/2003 | Dayanand et al. |
| 6,856,312 | B1 | 2/2005 | Imai et al. |
| 7,400,323 | B2 | 7/2008 | Nigro |
| 7,595,799 | B2 | 9/2009 | Nigro |
| 7,742,629 | B2 | 6/2010 | Zarkh et al. |
| 7,952,575 | B2 | 5/2011 | Rosel |
| 9,589,389 | B2 * | 3/2017 | Bonner .................. G06T 17/20 |
| 2008/0225043 | A1 | 9/2008 | Rosel |
| 2008/0303810 | A1 | 12/2008 | Bae et al. |
| 2013/0127836 | A1 | 5/2013 | Joshi et al. |
| 2013/0127857 | A1 | 5/2013 | Carr et al. |
| 2013/0135302 | A1 | 5/2013 | Bonner et al. |

OTHER PUBLICATIONS

Szeliski, "Surface Modeling with Oriented Particle Systems", ACM Computer Graphics, Jul. 1992, pp. 187-188.*
U.S. Appl. No. 14/684,123, filed Apr. 10, 2015, Bonner et al.
Wei Lin , Mechanic Design and Study, vol. 25 No. 4, "Key Technology in a Complex Curved Surface CAD Reconstruction Design", Research the Key Technologies of Restructuring Design with CAD for Complex Surface, 2009, 1 Page (submitting English abstract only).
William Y. Chang; "Surface Reconstruction from Points"; Technical Report for the Research Exam UCSD CSE Technical Report CS2008-0922 Feb. 1, 2007; XP55060121; URL:http://cseweb.ucsd.edu/wychang/papers/fa06wychang.pdf; 18 pages.
Shigeru Muraki; "Volumetric shape description of range data using "Blobby Model""; Proceedings of the 18$^{th}$ Annual Conference on Computer Graphics and Interactive Techniques; SIGGRAPH '91; vol. 25; Jan. 1, 1991;pp. 227-235; XP055121916.
Wenping Wang et al.; "Computation of rotation minimizing frames"; ACM Transactions on Graphics; vol. 27; No. 1; Mar. 1, 2008; pp. 1-18; XP055121595.
Fatemeh Abbasinejad, et al.; "Surface Patches from Unorganized Space Curves"; Eurographics Symposium on Geometry Processing; Jul. 20, 2011; XP002677309; URL:http:graphics.cs.ucdavis.edu/fabbasj/SurfacePatches/SurfacePatches.pdf.; 10 pages.
S. Morigi, et al.; "Reconstructing surfaces from sketched 3D irregular curve networks"; Proceedings-SBIM 2011: ACM SIGGRAPH/Eurographics Symposium on Sketch-Based Interfaces and Modeling; Aug. 7, 2011; pp. 39-46; XP002677310.
Andrew Nealen et al.: "Fibermesh: Designing freeform surfaces with 3D curves"; ACM Transactions on Graphics; vol. 26, No. 3, 41; Jul. 2007; 10 pages; XP002677311.
D. Zorin, et al.; "Interactive Multiresolution Mesh Editing"; Computer Graphics Proceedings, SIGGRAPH 97; Los Angeles; Aug. 3, 1997; XP000765824; 10 pages.
T. Nishita et al.; "A scan line algorithm for rendering curved tubular objects"; Computer Graphics and Applications; 1999; Proceedings. Seventh Pacific Conference on Seoul, South Korea.; Oct. 5, 1999; 10 pages; XP010359477.
European Search Report dated Jun. 10, 2014, in Europe Application No. 14 30 5530.
European Search Report dated Jun. 5, 2014, in Europe Application No. 14 30 5529.
European Search Report dated Jun. 7, 2012, in Europe Application No. 11 30 6583.
Alexander Hornung, et al.; "Robust Reconstruction of Waterlight 3D Models from Non-uniformly Sampled Point Clouds Without Normal Information"; Eurographics Sysmposium on Geometry Processing (2006); Konrad Polthier, Alla Sheffer (Editors); 10 pages.
F. Calakli, et al.; "SSD: Smooth Signed Distance Surface Reconstruction"; Pacific Graphics 2011; Jan Kautz, Tong-Yee Lee, and Ming C. Lin (Guest Editors); vol. 30 (2011), No. 7; 10 pages.
Michael Kazhdan, et al.; "Poisson Surface Reconstruction"; Eurographics Symposium on Geometry Processing (2006); Konrad Polthier, Alla Sheffer (Editors); 10 pages.
William E. Lorensen et al.; "Marching Cubes: A High Resolution 3D Surface Construction Algorithm"; Computer Graphics; vol. 21, No. 4; Jul. 1987, 7 pages.
Evangelos Kalogerakis, et al.; "Robust Statistical Estimation of Curvature on Discretized Surfaces" Eurographics Symposium on Geometry Processing (2007); Alexander Belyaev, Michael Garland (Editors); 10 pages.
E. Tosun, et al; "Shape Optimizing Using Reflection Lines"; Eurographics Symposium on Geometry Processing (2007); Alexander Belyaev, Michael Garland (Editors); 10 pages.
Wenping Wang, et al.; "Computation of Rotation Minimizing Frames" ACM Transactions on Graphics; vol. 27, No. 1, Article 2; Mar. 2008; 18 pages.
Michael Kazhdan; "Reconstruction of Solid Models from Oriented Point Sets"; Eurographics Symposium on Geometry Processing (2005); M. Desbrun, H. Pottman (Editors); 11 pages.
James Kennedy, et al.; "Particle Swarm Optimization"; Purdue School of Engineering and Technology; Indianapolis; 1995 IEEE; 7 pages.
David Bommes, et al.; "Integer-Grid Maps for Reliable Quad Meshing"; ACM Transactions on Graphics 32, 4; Proc. SIGGRAPH 2013; 12 pages.

* cited by examiner

FITTING SAMPLE POINTS WITH AN ISOVALUE SURFACE

CROSS-REFERENCE TO RELATED APPLICATIONS

This application claims priority under 35 U.S.C. § 119 or 365 to European Application No. 14305529.1, filed Apr. 10, 2014. The entire teachings of the above application(s) are incorporated herein by reference.

FIELD OF THE INVENTION

The invention relates to the field of computer programs and systems, and more specifically to a method, system and program for designing a three-dimensional modeled object.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Some systems allow the creation of shapes from provided sample points, e.g. point measurement data. A survey can be found in Chang (2007), *Surface Reconstruction from Points*, UCSD CSE Technical Report CS2008-0922. The following documents provide such solutions: Hornung (2006), *Robust reconstruction of watertight 3D models from non-uniformly sampled point clouds without normal information*, Symposium on Geometry Processing; Calakli (2011), *SSD: Smooth Signed Distance Surface Reconstruction*, Computer Graphics Forum; and Kazhdan (2006), *Poisson Surface Reconstruction, Symposium on Geometry Processing*, Eurographics. The possibilities in the state of the art can be summarized as follows. The point cloud can be unoriented (no associated outward orientation information) but in that case, it must be relatively dense. Typically it has to contain tens of thousands of points even for the simplest of shapes. On the other hand, if the points are oriented in the input, that is there is a known orientation vector for each point indicative of the normal direction to the shape, then it can be relatively sparse. However, this implies the burden of defining such orientation vectors. Indeed, existing techniques generally do not propose a satisfying solution for reconstruction of closed, watertight shapes from very sparse point clouds without any associated orientation information.

Some other techniques exist for creating shapes from a plurality of curves, as discussed in European application No. 11306583.3 which provides one solution itself and lists other solutions, such as the ones described in Abbasinejad (2011), *Surface Patches from Unorganized Space Curves*, Symposium on Geometry Processing, Eurographics, or Morigi (2011), *Reconstructing Surfaces from sketched 3D irregular curve networks*, Eurographics Symposium on Sketch-Based Interfaces and Modeling. These approaches all have in common that they aim at producing a boundary representation (B-Rep), which is a representation of choice for high quality manufacturable objects (consumer goods, cars, aircraft). In order to create a B-Rep, such techniques assume that the curves in some way represent a network, and that a boundary can be built that exhibits roughly the topology of this network. This has a couple of important implications. Firstly there must be some means of inferring how the curves cross in 3D space. And then, once their crossings are known, loops and faces must be computed in order to infer the topology of the boundary. Regardless of whether the B-Rep is an open or closed shape, the above mentioned network constraints will still have to be satisfied for it to be usable, which implies a relative burden on the designer.

Within this context, there is still a need for an improved solution to design a 3D modeled object.

SUMMARY OF THE INVENTION

It is therefore provided a computer-implemented method for designing a three-dimensional modeled object that represents a physical entity. The method comprises providing sample points. The method also comprises determining a volumetric function, within a predetermined class of volumetric functions, as the optimum of an optimization program that explores orientation vectors defined at the sample points. The optimization program penalizes a distance from the explored orientation vectors. And the method comprises fitting the sample points with an isovalue surface of the volumetric function. The program further penalizes oscillations of the fitted isovalue surface.

The method may comprise one or more of the following:
the oscillations for an explored volumetric function involve the volume integral of a positive function of a derivation of the explored volumetric function;
the positive function is the square function;
the derivation of the explored volumetric function is a normalization of the explored volumetric function obtained by subtracting the average value of the volumetric function at the sample points;
the optimization program is
i. $f^*(p) = f(\mathrm{argmax}_{\theta,\varphi} \iiint_V f(\theta,\varphi,p)_{nor}^2 \, dv, p)$
ii. where $P = \{p_1 \ldots p_N\}$ are the sample points, F is the predetermined class of volumetric functions, defined on volume domain V, and $$f(\theta, \phi, p)_{nor} = f(\theta, \phi, p) - \frac{\sum_i f_{\theta,\phi}(p_i)}{N}$$

is the normalization of an explored volumetric function $f(\theta,\varphi,p)=\text{argmin}_{f \in F} \Sigma_i \|\nabla f(p_i)-n_{\theta_i\varphi_i}\|$, wherein $N=\{n_{\theta_i\varphi_i} \ldots n_{\theta_N\varphi_N}\}$ are explored orientation vectors defined at the sample points P by azimuth and elevation angles $\theta=\{\theta_1 \ldots \theta_N\}$ and $\varphi=\{\varphi_1 \ldots \varphi_N\}$;

the sample points correspond to 3D curves sketched by a user and the optimization program explores the orientation vectors under the constraint that the explored orientation vectors be normal to the 3D curves and respect a minimal rotation propagation condition over each 3D curve;

the constraint that the explored orientation vectors respect a minimal rotation propagation condition corresponds to an application of the double reflection method;

the determining comprises solving the optimization program by a meta-heuristic optimization;

the meta-heuristic optimization is the particle swarm optimization;

the distance from the explored orientation vectors involves the difference between the gradient of the argument volumetric function and the explored orientation vector at the sample points;

the distance from the explored orientation vectors involves the sum of the norms of the difference between the gradient of the argument volumetric function and the explored orientation vector at the sample points; and/or the physical entity is a manufacturing product.

It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
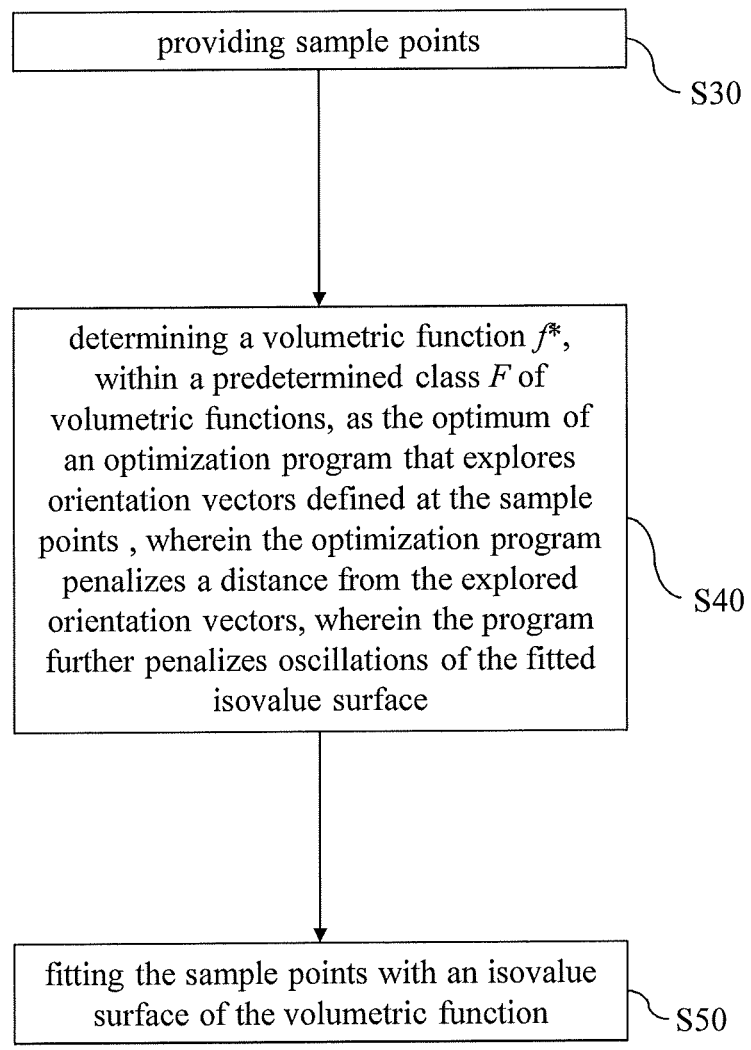
FIG. 1 shows a flowchart of an example of the method.

With reference to the flowchart of FIG. 1, it is proposed a computer-implemented method for designing a three-dimensional modeled object that represents a physical entity. The method comprises providing S30 sample points. The method also comprises determining S40 a volumetric function $f^*$, within a predetermined class F of volumetric functions, as the optimum of an optimization program. The optimization program explores so-called orientation vectors. The orientation vectors are vectors that are defined at the sample points. The optimization program penalizes a distance from the explored orientation vectors. The program further penalizes oscillations of a (later) fitted isovalue surface. And the method comprises fitting S50 the sample points with such an isovalue surface of the volumetric function. Such a method improves the design of a three-dimensional modeled object.

Notably, the method operates on an initial discrete representation (i.e. the sample points), and thus performs relatively fast. Since the sample points are fitted with the isovalue surface of a volumetric function determined by the optimization program, and since the program penalizes a distance from the explored orientation vectors, the method interprets the sample points provided as intended to represent the 3D modeled object. Because the approach of the method is volumetric, it is not subject to any topological limitations and it requires relatively little information. Notably, the provided sample points can be relatively sparse. Moreover, the sample points are not required to be provided with orientation vectors. More importantly, since the optimization program penalizes oscillations of the fitted isovalue surface, the method eventually results in a surface that is smooth, which amounts to relatively high quality in a context where it is intended to represent a physical entity (i.e. a material object of the real world, e.g. solid and/or liquid), for example a manufacturing product, notably in mechanical design.

The sample points may thus be sparse. In an example, the average distance between two sample points is inferior to $\frac{1}{10}$ of the square root of the area of the surface fitted at S50.

The method is computer-implemented. This means that the steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement the user's wishes. In examples, this level may be user-defined and/or pre-defined.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (eg. one for the program, and possibly one for the database).

The method generally manipulates modeled objects. A modeled object is any object defined by data stored in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts, or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore or transportation.

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systemes under the trademark DELMIA®.

CAE stands for Computer-Aided Engineering. By CAE solution, it is meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systemes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systemes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systemes under the trademark ENOVIA®.

Figure 2:
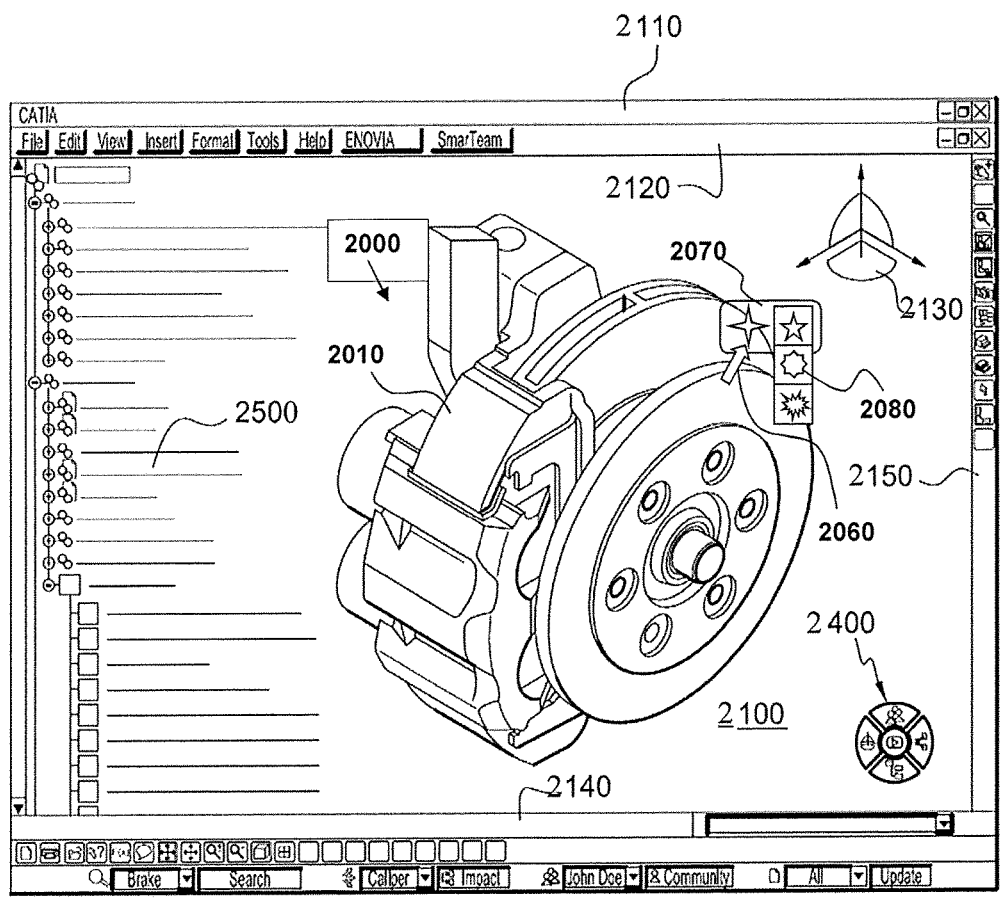
FIG. 2 shows an example of a graphical user interface of the system.

FIG. 2 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100, displayed 3D modeled object 2000 being for example the result of performing the method. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
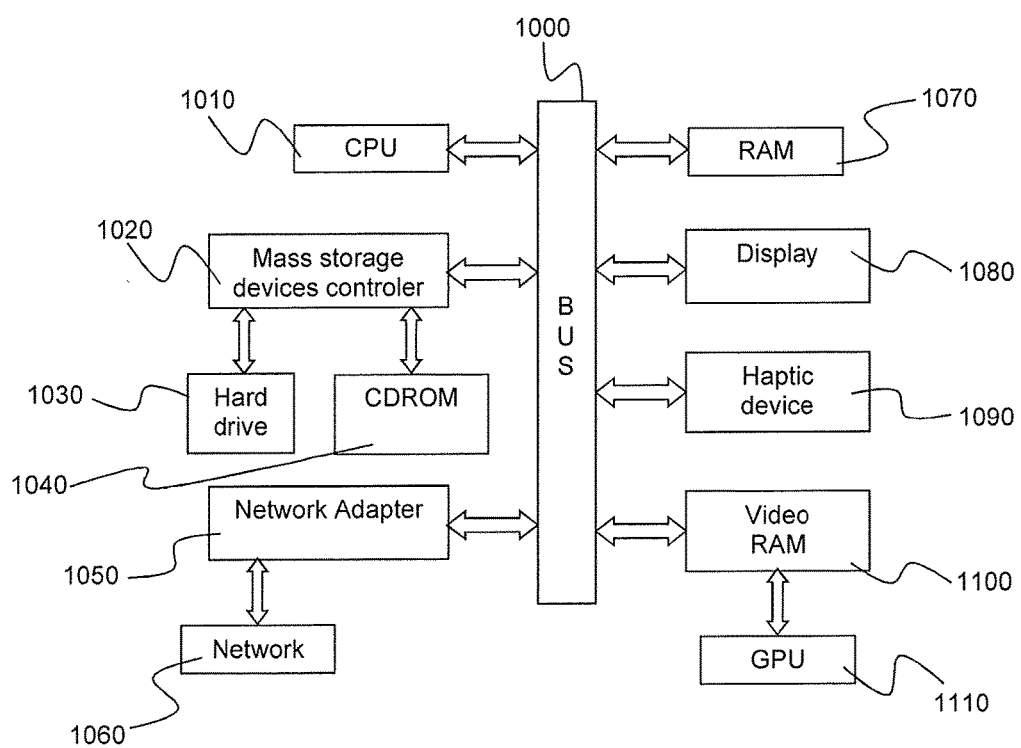
FIG. 3 shows an example of the system.

FIG. 3 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding to the modeled object. Indeed, in an example, the modeled object designed by the method may represent a manufacturing object. In other words, the modeled object represents the geometrical shape of an object that is manufacturable, for example in one of the industries listed earlier. Thus, the 3D modeled object conveys information that allows an industrial specialist to manufacture it. The modeled object may thus be a modeled solid (i.e. a modeled object that represents a solid). The manufacturing object may be a product, such as a part, or an assembly of parts. The parts may be mechanical parts. The surface outputted by the method may be at least part of representing accurately geometry of the manufacturing object, such that said object may be manufactured by a manufacturer. Because the method improves the design of the modeled object, the method also improves the manufacturing of a product and thus increases productivity of the manufacturing process.

The method may alternatively be included in a geophysical modeling process, which may comprise, prior to the method, collecting geological data, i.e. data that describe a geological formation in terms of positions associated to other type(s) of characteristic(s), e.g. that describe a natural surface or subsurface features of the earth. The method may thus represent a reconstruction of a geological or geophysical feature, such as a rock formation, magma chamber, or salt dome. The providing S30 of the sample points is now discussed.

The sample points provided at S30 are the input of the method. As such, the sample points are merely provided as 3D points defined by their 3D positions in the design scene. However, as the 3D modeled object represents a physical entity, for example a manufacturing product (e.g. a mechanical part), or a geological formation (e.g. a geological surface) the sample points and thus the fitted surface represent geometry of said physical entity. This is also the case for the possible 3D curves now discussed.

The sample points may in effect correspond to 3D curves sketched by a user. Indeed, the sample points may be those of a sampling/discretization of 3D curves previously sketched by a user. Thus, the method may comprise, prior to the providing S30, sketching 3D curves by the user in any known way, for example using a haptic device such a touchpen with a sensitive screen and/or touchpad, and sampling the 3D curves. The sampling may be performed in any way, for example with regular steps between two points, e.g. with a constant length or constant time (during the sketching) between two consecutive sample points. Because the sample points may come from curves, the sample points may be divided according to the curve from which they come from. And the sample points of a same 3D curve are associated together (e.g. specific data such as links or references indicate this association). Because the sample points may come from sketched curves, the sample points may be organized in specific ways, and are in any case not random. Notably, designers of specific fields such as mechanical design are used to sketching 3D curves in specific predetermined ways. The method then facilitates design as only sketching curves is necessary, which is easier for the designer than designing a surface.

Also, in an example, the sketched 3D curves are possibly intended by the user to define a number of crossings. The definition of "crossing" referred to herein is the same as disclosed in European patent application No. 11306583.3, which is incorporated herein by reference. The crossings may be detectable according to said European patent application No. 11306583.3, e.g. without the projection on a support disclosed in European patent application No. 11306583.3 (since the presence of such a support may be excluded by the present method, i.e. the present method is performed in the absence of such a support—among the input information). The sketched 3D curves may however be such that the method of European patent application No. 11306583.3 may be unapplicable (at least with a satisfying result) without the use of a support.

The 3D curves may possibly be sketched by a user (e.g. a specialist) from scratch, or on the basis of starting data, e.g. incorporating in any case specialist know-how (e.g. mechanical design or geologist know-how).

However, the sample points may alternatively or additionally originate from other sources. For instance, the sample points may originate from physical measurements, including laser, optical, magnetic, electrical and/or ultrasonic measurements. These may be measurements of an object, e.g. a version or a prototype of a manufacturing product, for example laser measurements and/or depth measurements. Thus, the method may be applied in all domains where it is useful to build a 3D model of existing objects. Also, the measurements may be geological measurements. This may be the case for the above-mentioned geological application of the method. In this case, the measurements typically indicate 3D positions, notably underground positions of geological layers or surfaces. Yet in another example, the measurements may be performed on a living being to represents organs (in which case the physical entity is an organ), for example in the case of angiography. In any case, the measurements are physical measurements from which sample points that represent geometry of the physical entity can be derived.

In yet another example possibly combined to the previous examples, the sample points are obtained by sketching 3D curves by the specialist designer on the basis of starting sample points, and then by sampling the 3D curves (the final sample points (i.e. those provided at S30) being possibly totally different from the starting sample points. The starting sample points may originate from the above-mentioned other sources, and for instance from physical measurements as described above.

In particular, the method addresses the case where the data is very sparse, consisting of single points or groups of points separated by important empty areas. This occurs often in measurement, for various reasons, including measurement methods that are costly per measured point, occlusions that cause the measured object to only be measurable in certain locations, upstream filtering that has discarded large parts of the data as unreliable, and many others. Also, the invention applies in particular to the case of 3D points with no associated normal, or when this associated information exists but is unreliable.

The determining S40 and the fitting S50 are now discussed.

The determining S40 outputs a volumetric function, noted $f^*$, selected within a predetermined class F of volumetric functions, and this volumetric function $f^*$ is used next to fit at S50 the sample points with an isovalue surface thereof. A volumetric function is a continuous function defined over a volume. Thus, isovalue surfaces of a volumetric function are continuous. In the case of the method, the volumetric functions of F are defined over a volume containing the sample points and may be scalar. The predetermined class F is merely a set of such volumetric functions of whose form is predetermined, but which implement variable parameters. The determining S40 thereby determines values to be retained for these parameters. The predetermined class F may be adapted to the application foreseen by the method. Thus, the predetermined class may be user-defined, e.g. by selecting a type of physical entity supposedly represented by the sample points. Such type may be included in a predetermined list of types, e.g. including manufacturing object (such type being possibly declined in subtypes each corresponding to a respective industry, e.g. to one or more of the above-listed industries) and/or geological formation (here again, such type being possibly declined in subtypes). For example, the predetermined class F presents a variability of volumetric functions high enough so that the method can perform the fitting S50 in a satisfactory way to the user, according to the field of application. However, the predetermined class F may be relatively small in terms of variability of functions offered, so that the determining S40 performs fast. Thus, an optimal variability achieving a good tradeoff between speed of performance and accordance with user-intent (i.e. quality of the result) may be contemplated by the method.

Also, the predetermined class F may consist of volumetric functions whose isovalue surfaces define envelopes (i.e. closed shapes). This provides a good so-called <<support>> in the context of mechanical design. Indeed, the method may be interlaced with a process for creating a surface from a plurality of 3D curves, that comprises providing a plurality of 3D curves, determining crossings between pairs of the curves, wherein determining the crossings includes determining at least one crossing between a respective pair of the curves as a pair of points, each belonging to a different one of the respective pair of the curves, the method comprising projecting the plurality of 3D curves on a support, thereby obtaining a plurality of corresponding projected curves, determining crossings between pairs of the projected curves, and retrieving the pairs of points of the curves corresponding to the crossings between pairs of the projected curves, defining a base graph comprising nodes representing the crossings and arcs connecting pairs of nodes representing crossings that are neighbors, determining, from the graph, a mesh comprising vertices defined by a 3D position and edges connecting pairs of the vertices, and fitting the mesh with a surface. The process for creating a surface can be the one described in European patent application No. 11306583.3, which is incorporated herein by reference. The method may thus provide fast and robustly, via its volumetric approach, the support used in said process for creating a surface, thereby facilitating the determination of the crossings, which are used to next determine a refined surface, such as a B-Rep. Also, the 3D curves provided in the process for creating a surface may be the same ones that may be sketched by the user and from which the sample points that are provided at S30 in the method originate.

Alternatively, the method could choose to adopt the surface produced at S50 as the definitive shape. If a B-Rep topology is required, the method may obtain it by a quad meshing technique such as described in Bommes (2013), *Integer-Grid Maps for Reliable Quad Meshing*, SIGGRAPH. This is particularly useful when the sketched curves do not correspond to a connected network. This results in an increase of overall robustness.

The method may further be simply used to assign a normal vector to each sample point. Indeed, as explained later the method explores orientation vectors defined at the sample points and thus eventually retains optimal orientation vectors, that are not necessarily outputted. These optimal vectors may actually be outputted by the method, as associated the sample points, to define "normal vectors", i.e. vectors that are supposed to be normal to the surface represented by the sample points. This amounts to assigning to each point an extra attribute: a unit normal vector, its position at any time being defined by the two variables azimuth and elevation. This transforms the set of sample points into an set of oriented points, which can be the input of other methods known in the prior art to determine a surface.

Examples of the predetermined class F may include the class of sums of trigonometric functions, corresponding to the Fourier Analysis technique. The Fourier basis is used to define a $\mathbb{R}_3 \to \mathbb{R}$ indicator function whose value is positive in the interior of the 3D shape and null outside, with a narrow band around the surface in which the value varies. The individual Fourier terms of this volumetric function are expressed as follows, $$\hat{\chi}_M(l, m, n) = \frac{1}{N} \sum_{j=1}^{N} \langle \vec{F}_{l,m,n}(\vec{p}_j), \vec{n}_j \rangle$$

Where:

$$\vec{F}_{l,m,n}(x, y, z) = \begin{pmatrix} \frac{il}{l^2 + m^2 + n^2} e^{-i(lx+my+nz)} \\ \frac{im}{l^2 + m^2 + n^2} e^{-i(lx+my+nz)} \\ \frac{in}{l^2 + m^2 + n^2} e^{-i(lx+my+nz)} \end{pmatrix}$$

The indices l,m,n vary from −b to +b, where b, or bandwidth, is a positive integer. In our case, we typically use values $10 \leq b \leq 40$. The indices l,m,n being symmetric around zero, the terms for negative l,m,n values are conjugate to the terms for positive l,m,n, and the imaginary terms cancel out. Therefore, the indicator function is real valued.

The above formulation is designed such as to facilitate, by construction, the alignment of the orientation vectors with the gradient of the indicator function, which contributes to the determining S40. Below we briefly present why this is the case.

The indicator function is null outside the 3D shape. Furthermore the terms $\hat{\chi}_M(l, m, n)$ of the series are orthogonal. Thus the integral of each term over the entire domain will be reasonably approximated by its integral over the interior of the 3D shape:

$$\hat{\chi}_M(l,m,n) = \int_{p \in M} e^{-i(lx+my+nz)} dp$$

Furthermore, by Stokes' theorem, the volume integral can be expressed as a surface integral:

$$\int_{p \in M} e^{-i(lx+my+nz)} dp = \int_{\partial M} \langle \vec{F}(p), \vec{n}(p) \rangle dp$$

We consider that the oriented point set constitutes a sampling of the isovalue surface enclosing the 3D shape. By applying Monte Carlo integration, we obtain as solution the summation over N seen previously, which approximates to any desired precision a volumetric indicator function fulfilling the "penalize distance from the explored orientation vectors" aspect of determining S40.

Since the volumetric function is defined only up to an additive constant, in order to define the desired iso-surface, we subtract from the function its average value at the input points.

In the example discussed here, "penalize distance from the explored orientation vectors" in the determining S40 is addressed by the above choice of Fourier coefficients given a set of input oriented points, and "further penalizes oscillations of the fitted isovalue surface" is addressed by an optimization loop that varies the normal vectors associated to said input oriented points. However different choices of the predetermined class F can be made which would lead to another strategy. In particular, if a volumetric true distance function is used instead of an indicator function, the gradient of the function will be nonzero away from the shape boundary, and the input oriented point set will no longer uniquely determine the function choice. This can be conducive to optimizing for both aspects of S40 simultaneously, rather than separating them.

Finally, the computation of the fourier coefficients can be accelerated by convolution, using the Fast Fourier Transform. The underlying principle remains as described.

In general, integral calculus is a likely a component of any optimization strategy, and so for the predetermined class of functions F, it will be desirable to choose orthonormal function spaces convenient for integration purposes, for example haar or D4 wavelet bases or radial basis functions. More generally, it is convenient that the predetermined class of functions F constitutes an $L^2$ normed Hilbert space. Such predetermined classes allow a fast performing of the determining S40 and provide a high quality surface at S50, notably in the case of mechanical design.

The method fits at S50 the sample points with an isovalue surface of volumetric function $f^*$ determined at S40. The fitting may be performed in any way, as long as it corresponds to the user-intent that the sample points represent the surface. Thus, the fitting S50 may be performed by selecting the isovalue surface of $f^*$ that is the closest to the set of sample points, according to any distance, for example the sum of least squares. For example, the method may choose the isovalue surface with the value equal to the mean value of the sample points in the volumetric function. In another example, the isovalue surface may be the smallest one (in terms of area) that envelops the sample points, or on the contrary the largest one that is enveloped by the sample points (in the case the isovalue surface defines an envelope). Also, the isovalue surface may be trimmed to match the domain of the sample points, e.g. in the case the sample points do not define an envelope, which may be evaluated in any way. Because the approach of the method is volumetric, the method is not subject to any topological limitations, as mentioned earlier. Also, the separation between the solving of the optimization program at S40 and the fitting S50 increases speed (relative to finding the fitting surface directly as the solution of an optimization program). Internally, the isovalue surface can thus be modeled as an implicit function. The isovalue surface of volumetric function $f^*$ may be determined in any way, e.g. using the marching cube technique to obtain a triangle mesh, as disclosed in Lorensen (1987), *A high resolution 3D surface construction algorithm*, SIGGRAPH. The method may then convert the triangle mesh into the isovalue surface in any way, e.g. such as described in Kazhdan (2006), *Poisson Surface Reconstruction*, Symposium on Geometry Processing, Eurographics.

The volumetric function $f^*$ is determined as the optimum of a specific optimization program. As usual in the field of applied mathematics and optimization, the optimization program has at least one argument, which is the variable of which an optimum value is output when solving the optimization program. In the present case, the argument is the volumetric function, defined on the domain consisting of the predetermined class F. An optimization program may also have at least one free variable, which is a variable of which an optimum value is determined but not output when solving the optimization program. In the present case, the optimization program has the orientation vectors as free variables. In both cases (argument and free variable), it is said that the optimization program "explores" the argument/variable, meaning that the optimization program considers the varying values of an argument/variable to retain the optimal values. In general, the exploration does not necessarily imply that any computation is performed for explored argument/variables (i.e. the argument/variable values considered at a given time). Indeed, the exploration merely defines mathematically the optimization program, by indicating the argument/variable domain. However, in the case of meta-heuristic optimization mentioned later, the exploration may actually comprise computing the value of the objective function for the argument/variable values considered at a given time. As known, this value of the objective function is then improved until a predetermined convergence is reached, which is considered as indicative of the ending of the optimization, and thus of the reaching of the optimum. In the present case, the optimization program explores orientation vectors. In other words, the orientation vectors are a free variable of the optimization program. The argument (bound variable) is the function, noted $f$, searched within the predetermined class F. The orientation vectors are vectors defined at the sample points (i.e. each vector is associated to a respective sample points) and indicative of the orientation of the isovalue surface (i.e. the direction normal to the isovalue surface) at such sample points. This is translated in the optimization program by the fact that the optimization program penalizes a distance from the explored orientation vectors. In other words, be it defined as a minimum program or a maximum program, the optimization program tends to minimize a given distance from the explored orientation vectors, said distance ensuring that the orientation vectors are indicative of the normal direction to the later fitted isovalue surface. This allows respecting user-intent in the context of 3D sketching.

Apart from the distance, the optimization program further penalizes oscillations of the fitted isovalue surface.

The oscillations represent the irregularity of the fitted isovalue surface. This penalization of the oscillations can be implemented in any way, notably by the introduction in the optimization program of a term that tends to minimize any measure of the oscillations. Any theoretic measure can be contemplated, for example including a surface variation measure, e.g. involving the second order derivative of the surface. As a result of this penalization, the fitted isovalue surface is relatively smooth, which is most useful in many fields of design, notably when a manufacturing product is designed, and in particular in mechanical design.

In an example, the oscillations for an explored volumetric function involve the volume integral of a positive function of a derivation of the explored volumetric function. In other words, the oscillations of the resulting surface are penalized in the optimization program via tending to minimize a term that comprises the volume integral (i.e. integral over the volume containing the sample points) of a positive function (i.e. a function of positive values) of a derivation of the explored volumetric function (i.e. a term that is derived from the explored volumetric function in consideration). The derivation of the explored volumetric function is a function of the explored volumetric function. In this example, the method makes use of the observation that a high value for the sum of a positive function of the derivation (for example, as described later, distances to a shape over a volume, e.g. sum of squares) is an indicator of good shape quality. The root of this observation is that a well formed shape does not wrinkle or fold, and thus occupies a small portion of a volume (it visits less of the volume), whereas inversely folds or irregularities are space filling. This is in stark contrast to all other works in the domain of geometric modeling, where shape quality indicators depend on knowledge of the explicit boundary of a shape. Examples for the use of explicit boundary quality for shape optimization are provided by Kalogerakis, 2007, *Robust Statistical Estimation of Curvature on Discretized Surfaces*, Symposium on Geometry Processing for estimates of curvature on the boundary and by Tosun, 2007, *Shape Optimization Using Reflection Lines*, Symposium on Geometry Processing. The novel observation of the method allows objective function estimate based on an implicit representation on a spatial grid, which yields an efficient and stable optimization process. The method reliably produces good quality shapes, possibly from sparse point sets or point cluster sets (that may be provided by arbitrary sketched curves) with no supplementary indication of the interior-exterior given as input.

The positive function may be the square function. This makes the program easy to implement and the method fast to perform. Also, the derivation of the explored volumetric function may be a normalization of the explored volumetric function (i.e. a term that constitutes a normalization of the explored volumetric function, i.e. said volumetric function minus a given average) obtained by subtracting the average value of the volumetric function at the sample points. This provides a particularly good result in terms of the quality of surface.

This avenue has probably been overlooked because most research has tried to deal with very large point sets (millions of points) as opposed to very sparse sets (with only a few tens of points or point clusters). Another reason it would have been overlooked is the excessive cost of objective functions for shape quality, a problem also solved by the method, since the penalization of the oscillations make the objective function simple and thus the program fast to solve.

The optimization program may be solved with no constraint on the explored orientation vector, notably in the case the sample points originate from measurement data and no a priori information is available. However, in the case the sample points correspond to 3D curves sketched by a user, the method may make use of such information (although this is not necessary), and for example the optimization program may be solved under the constraint that the explored orientation vectors be normal to the curves and respect a minimal rotation propagation condition over each 3D curve. In other words, in such a case the optimization program does not simply minimize the distance from the explored orientation vectors within class F by exploring all possible orientation vectors, but restricts the optimization to a sub-category of orientation vectors. Since such an optimization program explores orientation vectors under the specific constraint that the explored orientation vectors respect a minimal rotation propagation condition over each 3D curve, the optimization program can be solved relatively fast (the domain of exploration being restricted) while respecting user-intent in most cases, notably in the case of mechanical design. In other words, the method solves the optimization program in a particularly efficient way.

The first restriction consists in ensuring that the explored orientation vectors are normal to the curves. In other words, each explored orientation vector defined at a sample point is constrained to be normal to the curve respective/associated to the sample point. This orthogonality condition can be implemented in any way, for example by approximating the tangent of the 3D curve by the line passing by the previous and next sample point on the 3D curve (with a specific and slightly different implementation for the borders of the 3D curve), or by keeping track of the actual tangent of the 3D curve in memory, and then by evaluating normal to the tangent in a straightforward way.

In an example, solving the optimization program comprises, when exploring the orientation vectors, computing for each sample point a tangent by interpolation with neighboring points. This can be done by a second order spline interpolation which assumes that the polyline contains at least five points. For a polyline having less than five points, a lower order approximation can be used. The method may assume that the first point has index 0 and the last point has index n. For internal points $x_i$, that is, when $2 \le i \le n-2$, the method may implement $t_i = x_{i-2} - 8x_{i-1} + 8x_{i+1} - x_{i+2}$. For boundary points, i.e., when $i=0, 1, n-1$ or $n$, the method may implement: $t_0 = -25x_0 + 48x_1 - 36x_2 + 16x_3 - 3x_4$; $t_1 = -3x_0 -$ 10x1+18x2−6x3+x4; tn−1=3xn+10xn−1−18xn−2+6xn−3−xn−4; and tn=25xn−48xn−1+36xn−2−16xn−3+3xn−4. When a curve is continuous to C1 or better, tangents need not necessarily be approximated by the method as they can be taken directly from taking the first derivative of the curve equation. In the example, solving the optimization program also comprises, when exploring the orientation vectors, computing an arbitrary orientation vector located at the first point of the polyline and perpendicular to the tangent of the first point. This may be done as follows. The method first compute threes vectors (^ being the notation for the vector product): nx=t^(1,0,0), ny=t^(0,1,0), nz=t^(0,0,1). Whichever of nx, ny, or nz has the largest norm, becomes the arbitrary orientation vector n. It is by construction perpendicular to the tangent at the first point.

As for the second restriction, the explored orientation vectors are ensured to respect the minimal rotation propagation condition over each 3D curve. In other words, for each 3D curve, the orientation vectors are defined so that their rotation propagation over the curve is minimal. The rotation propagation is any value indicative of the twisting of the orientation vectors along the curve (e.g. the cumulated rotation when the orientation vectors are projected on a same plane that cuts orthogonally the curve). The minimal rotation propagation condition reduces the dimension of the problem by the ratio between the number of sample points and the number of curves. Indeed, for each curve, a value retained for the orientation vector defined at one sample point of the curve generally uniquely defines the values of the orientation vectors defined at the other sample points. Thus, this condition greatly increases speed of the method. However, this is done smartly, as the minimal rotation propagation condition together with the normality condition corresponds to the user intent when sketching the curves, as can be observed in the field of 3D design, notably in the field of mechanical design.

The constraint that the explored orientation vectors respect a minimal rotation propagation condition may correspond to an application of the double reflection method. The double reflection method is a method disclosed in the paper *Computation of Rotation Minimizing Frames*, Wang & Juttler, ACM TOG, March 2008, that allows computing a comb of normal vectors to a curve that respect a minimal rotation propagation condition. The explored orientation vectors may thus be theoretically those that could be obtained by said double reflection method. The double reflection method computes an orientation vector normal to the curve at a second sample point with inputs being a first sample point of the curve, its associated orientation vector normal to the curve, and the second sample point. These steps are then repeated over consecutive sample points of the curve, thereby "propagating" the normal to the curve. The principle followed is to approximate a spherical surface that would fit the first and second points in both position and tangent, and such that the normal of the first point is normal to the surface. The normal at the second point is the sphere normal at that point. The method handles naturally the limit cases such as collinear tangents, in which case the fitted surface becomes a plane rather than a sphere. This method thus propagates by one step, that is, creates the orientation vector for a point n+1 from the data at point n. In the example discussed above, the inputs are, for each 3D curve, a first point with tangent vector and orientation vector, a second point with tangent vector but no orientation vector And the output is a orientation vector for the second point. And this is repeated over the 3D curve so as to compute all orientation vectors. Conceptually this method assures that the orientation vector will "twist as little as possible" as it is propagated along the polyline consisting of the sample points.

A preferred implementation of the example in pseudo-code is provided below:

i. Let p, t, n be position, tangent, normal at first point
ii. Let s = t $\hat{\ }$ n be the third vector of the reference frame at the first point
iii. Let $p_1$, $t_1$, $n_1$, $s_1$ = $t_1$ $\hat{\ }$ $n_1$ be position, tangent, normal and third vector at second point
iv. Let c, $c_1$ be intermediate scalars
v. Let $n^L$, $t^L$, v, $v_t$ be intermediate vectors
vi. Do:
vii. v := $p_1$ − p
viii. c := v · v
ix. $n^L$ := n − (2/c) (v · n)v
x. $t^L$ := t − (2/c) (v · t)v
xi. $v_t$ := $t_1$ − $t^L$
xii. $c_1$ := $v_t$ · $v_t$
xiii. $n_1$ := $n^L$ − (2/$c_1$) ($v_t$ · $n^L$) $v_t$
xiv. $s_1$ := $t_1$ $\hat{\ }$ $n_1$ The distance from the explored orientation vectors penalized by the optimization program is now discussed.

The distance represents how far a volumetric function considered by the optimization program is from a given set of explored orientation vectors. This penalization can be implemented in any way, notably by the introduction in the optimization program of a term that tends to minimize the distance between the two variables that ƒ* and the explored orientation vectors are (possibly parallel to other terms that achieve other penalizations). This is to express that user-intent is to fit the sample points with a surface that best relates to possible orientation vectors. The use of a proxy (distance between the optimal volumetric function and the orientation vectors) instead of the distance between the isovalue surface fitted at the end and the orientation vectors increases efficiency.

The explored orientation vectors and the volumetric function are not of the same dimension, but a distance between them can be defined in any way. In an example most adapted to mechanical design, the distance from the explored orientation vectors may involve the difference between the gradient of the argument volumetric function and the explored orientation vector at the sample points. In other words, the distance from the explored orientation vectors is penalized in the optimization program via tending to minimize a term that comprises the difference between the gradient of the argument volumetric function and the (free variable) explored orientation vector at the sample points. More specifically, the distance from the explored orientation vectors may involve the sum of the norms of the difference between the gradient of the argument volumetric function and the explored orientation vector at the sample points. In other words, the optimization program acts on both the volumetric function and the orientation vectors in a way to tend to minimize such a sum.

Notably in the case the optimization program restricts the exploration of the orientation vectors as described above, the determining S40 may comprise solving the optimization program by a meta-heuristic optimization. This allows a fast resolution of the program although said program penalizes two values (the distance and the oscillations) and explores two kinds of variables (volumetric function and orientation vectors). Thanks to certain choices of predetermined function class F, such as the Fourier functions presented earlier, the method can directly establish the volumetric function whose gradient is aligned with the orientation vectors. Having thus penalized by construction the distance from the explored orientation vectors, the method may require the meta-heuristic optimization to handle only the orientation vectors, which is desirable because such optimization is particularly fast when a small number of variables is involved.

The meta-heuristic optimization may be the particle swarm optimization, thereby ensuring a particularly efficient resolution. The Particle Swarm Optimization (PSO) is a specific type of meta-heuristic optimization disclosed notably in Kennedy, (1995), *Particle Swarm Optimization*, Proceedings of the IEEE International Conference on Neural Networks. Since meta-heuristic optimization such as this works best on small numbers of variables (typically under 100), the method may easily target very sparse point sets with typically less than 50 points. However, much larger point sets can be treated efficiently too, if the method groups them in a set of few sparse clusters, e.g. less than 50 clusters that can be each considered to behave like a single point. In this case, referring to the later provided explanations, a single azimuth and elevation value is defined by cluster, which applies to all points.

In an example of the method, the optimization program may be written as:

$$f^*(p) = f\left(\text{argmax}_{\theta,\phi} \int\int\int_V f(\theta, \phi, p)^2_{nor} dv, p\right)$$

In this program, $p=\{p_1 \ldots p_N\}$ are the sample points, here referred to without a notation indicative of their association to a sketched 3D curves. F is the predetermined class of volumetric functions, defined on volume domain V (i.e. the volume containing all the sample points).

$$f(\theta, \phi, p)_{nor} = f(\theta, \phi, p) - \frac{\sum_i f_{\theta,\phi}(p_i)}{N}$$

is the normalization of a given explored volumetric function $f(\theta,\phi,p)$ which is itself equal to $\text{argmin}_{f\in F}\Sigma_i\|\nabla f(p_i) - n_{\theta_i\phi_i}\|$, i.e. the argument of the program. The average value of the volumetric function at the sample points is noted $$\frac{\sum_i f_{\theta,\phi}(p_i)}{N}. \quad N = \{n_{\theta_1\phi_1} \ldots n_{\theta_N\phi_N}\}$$

are given explored orientation vectors defined at the sample points P by azimuth and elevation angles $\theta=\{\theta_1 \ldots \theta_N\}$ and $\phi=\{\phi_1 \ldots \phi_N\}$, i.e. free variable of the program.

In the formula above, the explored orientation vectors are generally free to take any values (i.e. $\theta$ and $\phi$ can generally take any values). However, when the method implements the above-discussed restriction on the orientation vectors (i.e. that they be normal to sketched 3D curves and respect a minimal propagation condition), the explored orientation vectors are determined by such constraint. This constrains $\theta$ and $\phi$ by reducing the degree of freedom (i.e. excluding all couples of values that do no respect the constraint).

The method thus conceptually first define a scalar volumetric function relative to given angle vectors $\theta$, $\phi$ by this program:

$$f(\theta,\phi,p) = _{f\in F}{}^{\text{argmin}}\Sigma_i\|\nabla f(p_i) - n_{\theta_i\phi_i}\|.$$

The method then normalizes by subtracting the average value of $f$ at the sample points:

$$f(\theta, \phi, p)_{nor} = f(\theta, \phi, p) - \frac{\sum_i f_{\theta,\phi}(p_i)}{N}.$$

And based on the above the method defines the desired function $f^*(p)$ from $f(\theta,\phi,p)$, by this program:

$$f^*(p) = f_{(\theta,\phi)}{}^{\text{argmax}}\iiint_V f_{\theta,\phi,nor}^2 dv, p).$$

A high quality surface does not oscillate or have useless folds or wrinkles. In general a high quality surface is minimal in shape. As such, it will have the minimum impact on the volume, and there will be a majority of points in the volume which are far from the surface. The key insight leading to the method of the example is that an attractive, regular surface will correspond to the highest possible positive value of the volume integral of the squared distance to the surface. For efficiency, the method of the example uses a proxy for the distance to the surface, which is an indicator function. The indicator function is like the true signed distance in that it is a scalar value defined over the volume, except that unlike the true distance the indicator varies only in a band around the surface, and clamps to a maximum in absolute value (gradient goes to zero) a certain distance from the surface. The clamping does not in practice hinder the optimization from finding the correct minimum. If for any reason it were preferred to optimize based on a true distance approximation rather than an indicator function, the formulation would remain the same overall, but the equation providing $f(\theta,\phi,p)$ would acquire regularization and point constraint terms. Finally, the program may be resolved by using Particle Swarm Optimizationas mentioned above. More generally the task can be handled by any global, derivative-free optimizer technique. A reference C code for Particle Swarm Optimization is available in a standard. Lastly the method of the example extracts, via Marching Cubes the zero iso-surface of $f^*(p)$, as explained above. This surface is the final result.

Elements of the method are now illustrated with reference to FIGS. 4-9.

Figure 5:
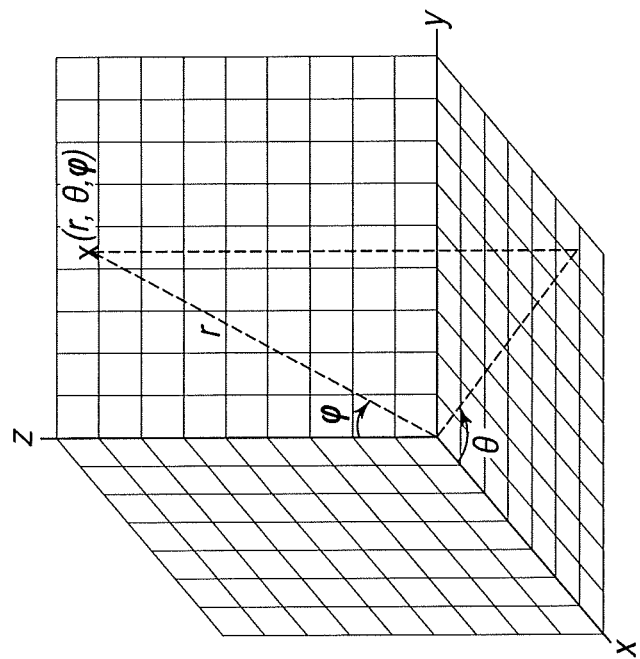
FIGS. 4-9 illustrate the method.
Figure 4:
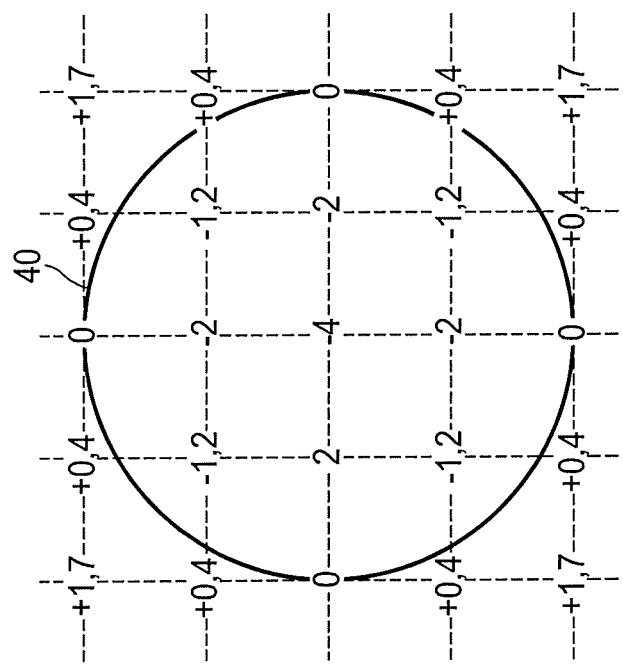
Figure 7:
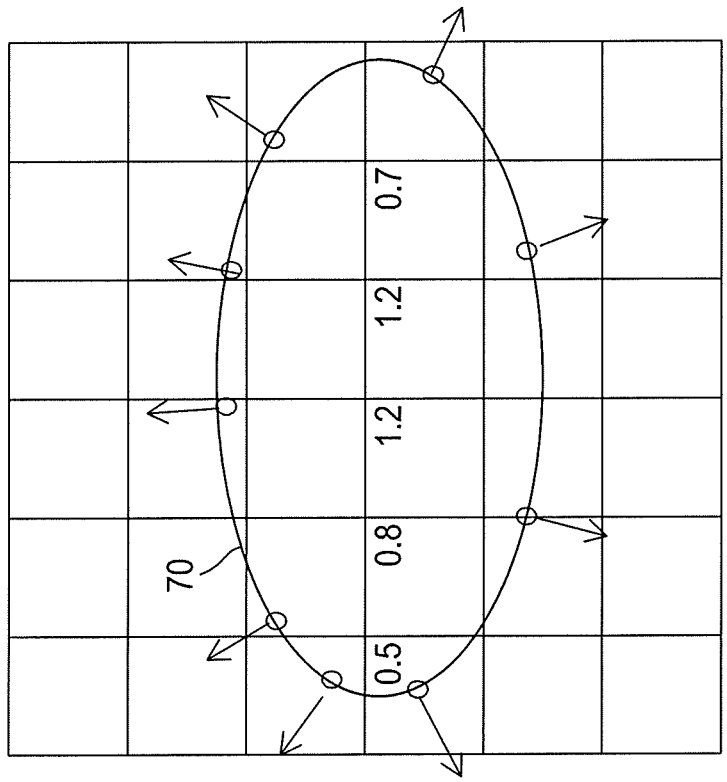
Figure 6:
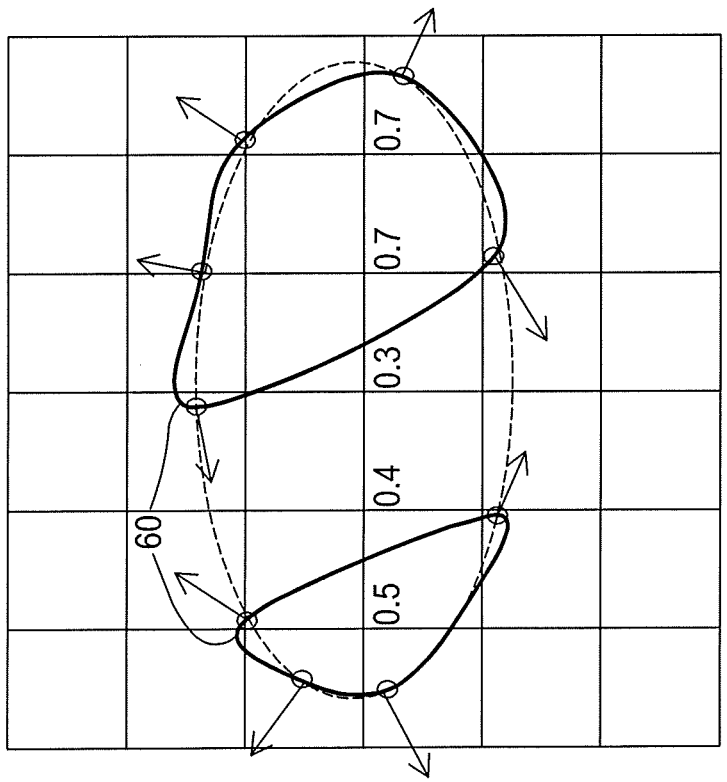

FIG. 4 shows a computer representation of a volumetric scalar signed distance function. The values at any point can be interpolated from the surrounding values. FIG. 4 shows schematically zero-isovalue surface 40. FIG. 5 shows spherical coordinates of a given sample point with azimuth $\theta$ and elevation $\phi$. In the case of the example, the vectors are unit length (i.e. r=1). FIGS. 6-7 illustrate how the method avoids suboptimal shape (FIG. 6) but rather leads to optimal shape (FIG. 7) with the specific example of the penalization of the oscillations discussed above. Indeed, in both cases the sample points (represented by bullets on the figures) and the orientation vectors (represented by arrows on the figures) are fitted well with a surface (surface 60 on FIG. 6 and surface 70 on FIG. 70). However, in the case of FIG. 6, the distance sum is equal to 0.5+0.4+0.3+0.7+0.7=2.6, whereas in the case of FIG. 7 it is equal to 0.5+0.8+1.2+1.2+0.7=4.4. The method searches the space of normal orientations to find the optimal solution. The objective function sums the (positive) values of distance to the surface. It is noted how the values corresponding to FIG. 6 sum to a lower total than the values corresponding to FIG. 7, whose volumetric function is thus selected.

Figure 8:
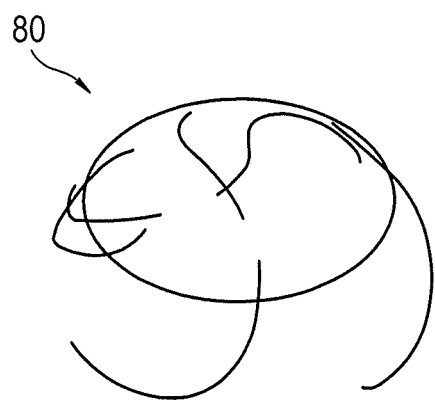
Figure 9:
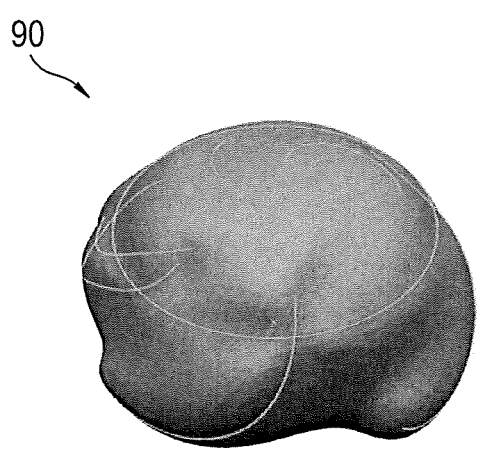

FIGS. 8-9 show a real example of applying the method in the case where the sample points originate from sketched 3D curves and the exploration of the orientation vectors is restricted as described above, with the above specific optimization program. Input sketched 3D curves 80 are efficiently and rapidly fitted with surface 90, which is particularly smooth.

The invention claimed is:

1. A computer-implemented method for generating a three-dimensional modeled object that represents a physical entity, comprising:
   providing sample points;
   determining a volumetric function, within a predetermined class of volumetric functions, as the optimum of an optimization program that explores orientation vectors defined at the sample points, wherein the optimization program penalizes a distance from the explored orientation vectors, wherein the distance from the explored orientation vectors involves a difference between a gradient of an argument volumetric function and an explored orientation vector at the sample points;
   fitting the sample points with an isovalue surface of the volumetric function, wherein the optimization program further penalizes oscillations of the isovalue surface; and
   displaying the three-dimensional modeled object generated based on the fitting.

2. The method of claim 1, wherein the oscillations for an explored volumetric function involve a volume integral of a positive function of a derivation of the explored volumetric function.

3. The method of claim 2, wherein the positive function is a square function.

4. The method of claim 2, wherein the derivation of the explored volumetric function is a normalization of the explored volumetric function obtained by subtracting an average value of the volumetric function at the sample points.

5. The method of claim 4, wherein the optimization program is: F $$F^*(p) = f\left(\operatorname{argmax}_{\theta,\phi} \int\int\int_V f(\theta, \phi, p)_{nor}^2 dv, p\right)$$

where:
   $p=\{p_1 \ldots p_N\}$ are the sample points,
   F is the predetermined class of volumetric functions, defined on volume domain V, and $$f(\theta, \phi, p)_{nor} = f(\theta, \phi, p) - \frac{\sum_i f_{\theta,\phi}(p_i)}{N}$$

is the normalization of the explored volumetric function $f(\theta, \phi, p)=\operatorname{argmin}_{f \in F}\Sigma_i\|\nabla f(p_i)-n_{\theta_i\phi_i}\|$, wherein $N=\{n_{\theta_1\phi_1} \ldots n_{\theta_N\phi_N}\}$ are explored orientation vectors defined at the sample points P by azimuth and elevation angles $\theta=\{\theta_1 \ldots \theta_N\}$ and $\phi=\{\phi_1 \ldots \phi_N\}$.

6. The method of claim 1, wherein the sample points correspond to 3D curves sketched by a user and the optimization program explores the orientation vectors under a constraint that the explored orientation vectors be normal to the 3D curves and respect a minimal rotation propagation condition over each 3D curve.

7. The method of claim 6, wherein the constraint that the explored orientation vectors respect the minimal rotation propagation condition corresponds to an application of a double reflection method.

8. The method of claim 6, wherein the determining comprises solving the optimization program by a meta-heuristic optimization.

9. The method of claim 8, wherein the meta-heuristic optimization is a particle swarm optimization.

10. The method of claim 9, wherein the distance from the explored orientation vectors involves a sum of norms of the difference between the gradient of the argument volumetric function and the explored orientation vector at the sample points.

11. The method of claim 1, wherein the physical entity is a manufacturing product.

12. A non-transitory data storage medium having recorded thereon a computer program that comprises instructions for performing a method of generating a three-dimensional modeled object that represents a physical entity, wherein the method comprises:
   providing sample points;
   determining a volumetric function, within a predetermined class of volumetric functions, as the optimum of an optimization program that explores orientation vectors defined at the sample points, wherein the optimization program penalizes a distance from the explored orientation vectors, wherein the distance from the explored orientation vectors involves a difference between a gradient of an argument volumetric function and an explored orientation vector at the sample points;
   fitting the sample points with an isovalue surface of the volumetric function, wherein the computer program further penalizes oscillations of the isovalue surface; and
   displaying the three-dimensional modeled object generated based on the fitting.

13. A system comprising a processor coupled to a memory and a graphical user interface, the memory having recorded thereon a computer program that comprises instructions for performing a method of generating a three-dimensional modeled object that represents a physical entity, wherein the method comprises:
   providing sample points;
   determining a volumetric function, within a predetermined class of volumetric functions, as the optimum of an optimization program that explores orientation vectors defined at the sample points, wherein the optimization program penalizes a distance from the explored orientation vectors, wherein the distance from the explored orientation vectors involves a difference between a gradient of an argument volumetric function and an explored orientation vector at the sample points;
   fitting the sample points with an isovalue surface of the volumetric function, wherein the computer program further penalizes oscillations of the isovalue surface; and
   displaying the three-dimensional modeled object generated based on the fitting.

* * * * *